United States Patent [19]
Casal et al.

[11] Patent Number: 5,524,035
[45] Date of Patent: Jun. 4, 1996

[54] SYMMETRIC CLOCK SYSTEM FOR A DATA PROCESSING SYSTEM INCLUDING DYNAMICALLY SWITCHABLE FREQUENCY DIVIDER

[75] Inventors: Humberto F. Casal; Rafey Mahmud, both of Austin; Trong Nguyen, Houston, all of Tex.; Mark L. Shulman, Staatsburg, N.Y.; Nandor G. Thoma, Plano, Tex.

[73] Assignee: International Business Machines Corporation, Armonk, N.Y.

[21] Appl. No.: 513,245

[22] Filed: Aug. 10, 1995

[51] Int. Cl.$^6$ ................................................ H03K 21/00
[52] U.S. Cl. ........................................................ 377/47
[58] Field of Search .................................... 377/47, 48

[56] References Cited

U.S. PATENT DOCUMENTS

| | | | |
|---|---|---|---|
| 3,701,027 | 10/1972 | Belton, Jr. ................................. | 328/17 |
| 4,318,045 | 3/1982 | Krupa et al. ............................... | 328/18 |
| 4,891,825 | 1/1990 | Hansen ...................................... | 377/52 |
| 4,935,944 | 6/1990 | Everett ...................................... | 377/48 |
| 5,023,822 | 6/1991 | Schlotterer et al. ....................... | 377/47 |
| 5,065,415 | 11/1991 | Yamashita ................................. | 77/52 |
| 5,077,686 | 12/1991 | Rubinstein ................................ | 377/47 |
| 5,167,031 | 11/1992 | Watanabe .................................. | 377/47 |
| 5,208,888 | 5/1993 | Wendell et al. ........................... | 375/106 |
| 5,253,279 | 10/1993 | Satoh ........................................ | 377/110 |
| 5,313,509 | 5/1994 | Tomita ...................................... | 377/44 |
| 5,371,772 | 12/1994 | Al-Khairi .................................. | 377/47 |

Primary Examiner—Margaret Rose Wambach
Attorney, Agent, or Firm—Anthony V. S. England; Jenkens & Gilchrist

[57] ABSTRACT

A dynamically switchable clock system having a symmetrical output signal includes a frequency doubler which couples the input frequency to provide greater resolution and synchronization of an output signal to an input signal in the frequency divider and the facility to handle odd divides as even divides at double frequency, a counter controlled by a divisor select signal, first and second compare circuits which compare against the preprogrammed count for division, the compare circuits receiving an input from the divisor select circuits, and having outputs to a counter reset line and to an output clock S/R latch which provides the frequency divided symmetrical output signal.

7 Claims, 5 Drawing Sheets

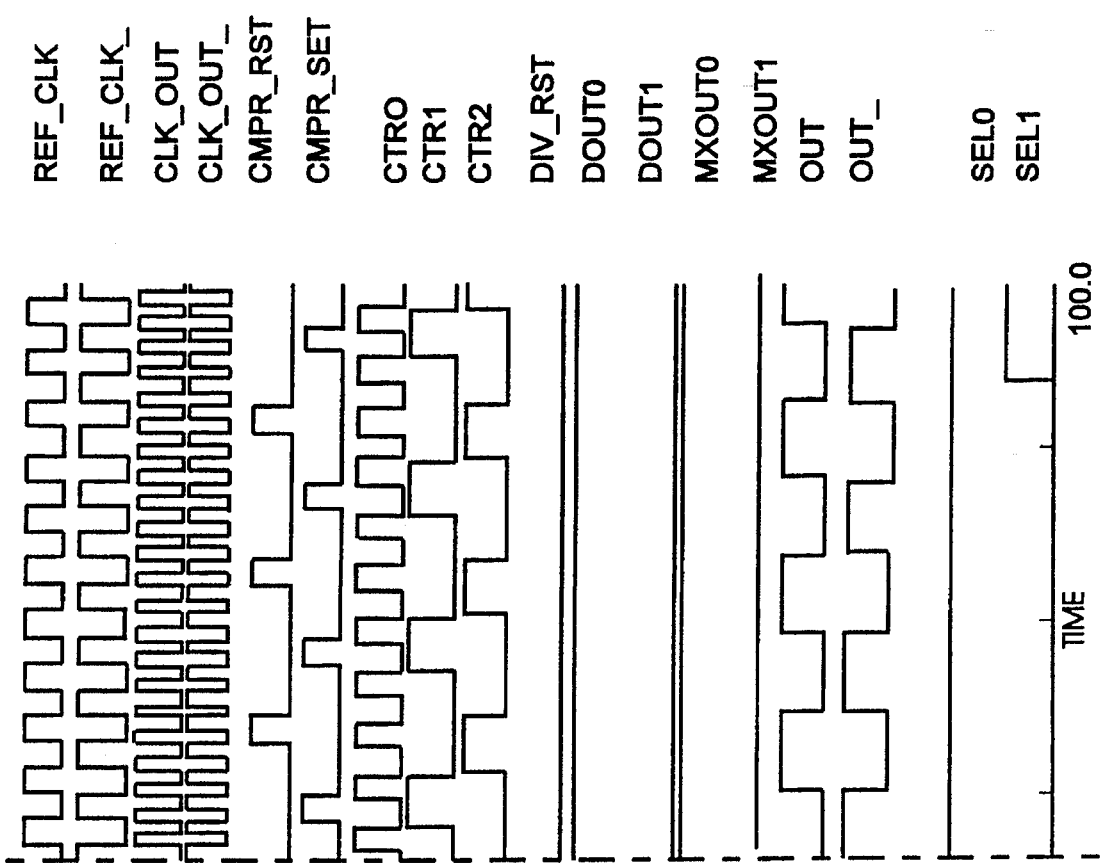

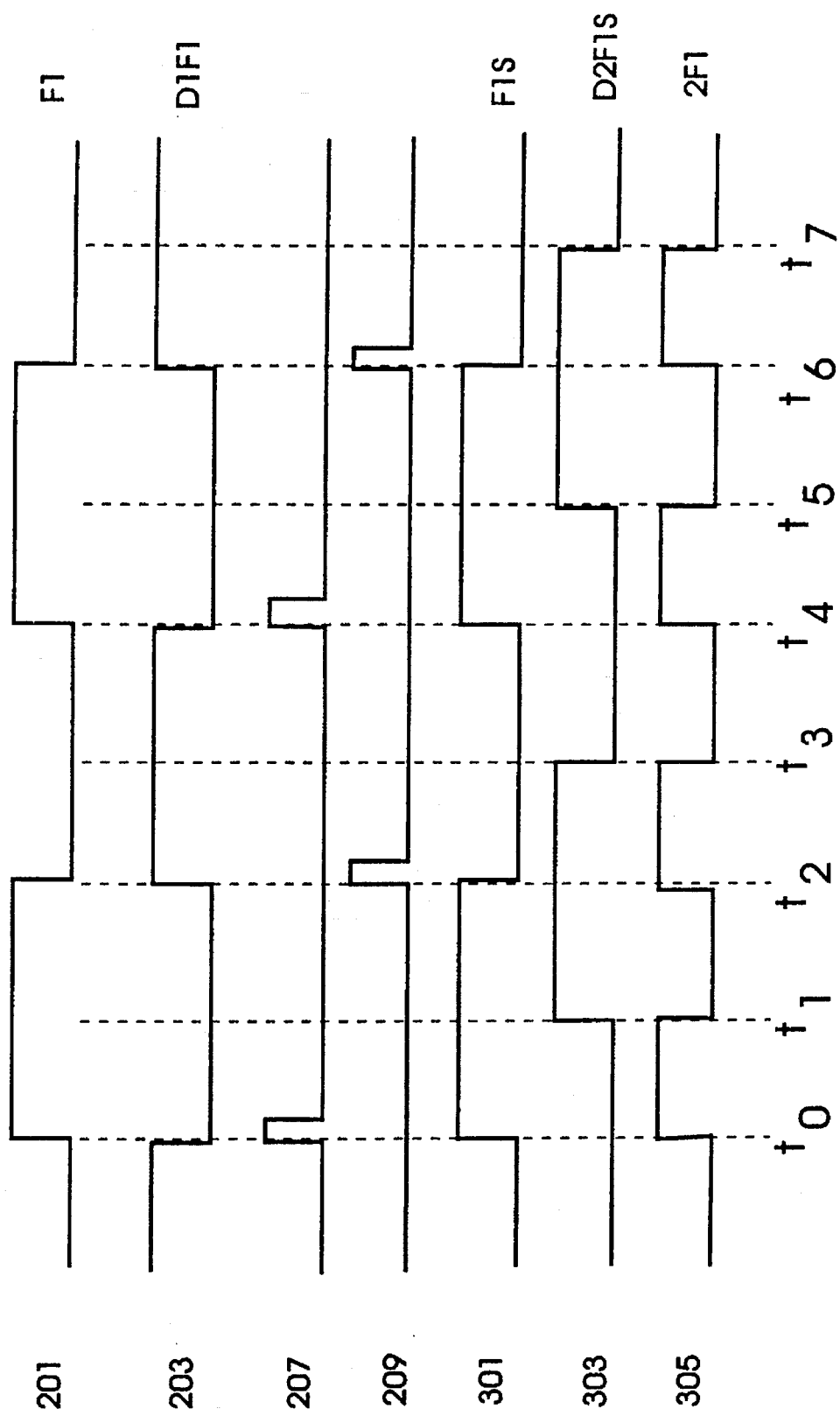

form SYMMETRIC CLOCK SYSTEM FOR A DATA PROCESSING SYSTEM INCLUDING DYNAMICALLY SWITCHABLE FREQUENCY DIVIDER

BACKGROUND OF THE INVENTION

1. Field of the Invention

The present invention relates to data processing systems, and more particularly to clock systems which control timing in data processing systems.

2. Prior Art

There are many clock system designs available to control the timing of a data processing system. The following patents are representative of the prior art and indicate some of the problems to be overcome.

U.S. Pat. No. 5,371,772 entitled "Programmable Divider Exhibiting a 50/50 Duty Cycle," teaches the division of a system reference clock signal by a programmer integer value. A storage register stores the value equal to the desired divisor minus 2. Thus, a stored value of 0 results in a divided by 2. It is not clear that divide by 1 can be achieved as an option in the system shown in the patent.

Control logic controls the output duty cycle to be 50/50 by toggling a flip-flop to coincide with system clock edges. This requires that the symmetry of the output signal is dependent upon the symmetry of the clock reference input signal.

The present invention provides for an option of a divide by 1 as well as having an output signal symmetry being independent of the input signal symmetry and also includes a frequency doubler on the input signal which is not taught in the referenced patent.

U.S. Pat. No. 4,318,045, entitled "Symmetrical Waveform Signal Generator Having Coherent Frequency Shift Capability," teaches an apparatus for generating a signal having a symmetrical waveform of frequency selectable according to a plurality of input signals. The frequency of the signal changes rapidly in response to changes in the input signals and changes occur in a coherent manner with no perturbation of the output signal. A high speed clock signal and the signals generated by its successive divisions are logically combined to produce a plurality of signals which are filtered to produce substantially symmetrical waveform signals which are maintained in periodic phase coherence.

As discussed above, the '045 patent depends on input signal symmetry to provide symmetry of the output clock signal. Further, the clock circuit taught by the '045 patent does not provide the 50/50 output symmetry of the present invention, nor does the '045 patent teach the use of a frequency doubler circuit on the input clock signal to facilitate division by odd integers.

U.S. Pat. No. 4,935,944 entitled "Frequency Divider Circuit with Integer and Noninteger Divisors," teaches a frequency divider circuit including a polynomial counter, decode logic, and a clock edge selector. The polynomial counter, in response to a clock signal at a predetermined frequency, cycles through a predetermined set of logic states which are logical combinations of the previous state and generates a set of output signals which indicates the present logic state of the polynomial counter. The decode logic, responsive to output signals of the polynomial counter implements a predetermined logical mapping of the output signals into a decoded output signal. The clock edge selector responsive to the decoded output signal of the decode logic utilizes flip-flops and other logic to generate integer and noninteger multiples of the clock signal. The frequency divider circuit selects either integer or noninteger divisors, depending on the information content of a control signal.

As discussed above, the '944 patent depends upon symmetry of the input clock signal to control symmetry of the output signal. Further the '944 patent does not teach a dynamically or synchronously switching division ration, but rather is limited to a fixed predetermined integer or noninteger divisor. Additionally, the '944 patent does not teach a frequency multiplier on the input clock signal.

U.S. Pat. No. 3,701,027 entitled "Digital Frequency Synthesizer", teaches a circuit for simultaneously generating a plurality of signals at related frequencies. A clock source having a frequency greater than the frequency of any of the signals to be generated is applied to an in put of a scalar circuit. The scalar circuit generates a plurality of output signals, there being an output signal from the scalar circuit corresponding to each of the related frequency signals to be generated. Some of the signals from the scalar have non uniform pulse-to-pulse spacing. The outputs of the scalar circuit are converted to signals at the desired frequencies with substantially uniform pulse-to-pulse spacing.

The '027 patent does not teach a clocking system having a 50/50 output symmetry independent of input clock symmetry. Further, the '027 patent does not teach the capability of dynamically and synchronously switching division ration.

In addition, there is no frequency multiplier shown on the input clock signal.

U.S. Pat. No. 5,065,415 entitled "Programmable Frequency Divider", teaches a frequency divider for dividing the frequency of a supplied high frequency signal directly into lower frequency signals and includes a number of prescalars or programmable frequency divider units each capable of being switched between divide by 2 and divide by 3 modes. The prescalars are connected in cascade for producing an output signal which is frequency divided at one or a multiple of division ratios at a time.

Although the '415 patent teaches a programmable frequency divider, it does not mention output symmetry and does not each an output symmetry which is not dependent upon input symmetry to provide a 50/50 output signal. Further, the frequency divider of the '415 patent does not teach nor suggest the possibility of a divide by 1 which can be very useful at power on time in a data processing system. Additionally, the '415 patent does not teach the use of a frequency multiplier on the input clock signal, nor is there any mention of controlling output delay regardless of division ratio which can be very important which dividers are used in clock distribution systems or as part of feedback loops.

U.S. Pat. No. 4,891,825 entitled "Fully Synchronized Programmable Counter With a Near 50% Duty Cycle Output Signal", shows a method and apparatus to generate a fully synchronized programmable frequency divider output having a near 50% duty cycle output signal independent of the divisor, whether odd or even, and suitable for use in phase lock loop frequency synthesizers.

Although the '825 patent has a near 50% duty cycle output signal independent of the divisor, the symmetry is not independent of the input clock symmetry as in the invention to be described and claimed herein. Further, the system shown in the '825 patent does not include a frequency multiplier on the input clocking signal.

U.S. Pat. No. 5,313,509 entitled "Pulse Counter With Arbitrary Output Characteristics", teaches a pulse counter having a programmable prescalar which divides the frequency of an input clock signal by a factor designated by a signal from a code generator which encodes count output from a programmable prescalar to generate the code signal which controls the programmable prescalar.

The counter of the '509 patent does not appropriate address the output symmetry issues in clocking systems, nor does the '509 patent address the problems of maintaining consent output delay regardless of division ratio which, as identified above, is very important when division is used in clock distribution systems. Further, the '509 patent does not include a frequency multiplier on the input clock line.

U.S. Pat. No. 5,253,279 entitled "Semiconductor Integrated Circuit Having a Built-In programmable Divider", teaches an input terminal provided for each of the output terminals such that the input circuit outputs either a high or low as a frequency dividing ratio setting signal when the corresponding input terminal is high or low, but outputs another one of high or low as a frequency dividing ratio setting signal when the corresponding input terminal is in an open state.

Although the '279 patent teaches a programmable frequency divider, it does not teach important aspects of the invention taught and claimed herein with respect to output symmetry independent of input signal symmetry, the capability of dynamically and synchronously switching frequency division ratio, nor the maintenance of constant output delay regardless of division ratio.

SUMMARY OF THE INVENTION

Therefore, it is an object of the present invention to provide symmetrical clock timing signals for a data processing system at odd and even frequency division ratios.

A dynamically switchable clock system having a symmetrical output signal includes a frequency doubler which doubles the input frequency to provide greater resolution and synchronization of an output signal to an input signal in the frequency divider and the facility to handle odd divides as even divides at double frequency, a counter controlled by a divisor select signal, first and second compare circuits which compare against the preprogrammed count for division, the compare circuits receiving an input from the divisor select circuits, and having outputs to a counter reset line and to an output clock S/R latch which provides the frequency divided symmetrical output signal.

It is an advantage of the present invention that the clock control circuit in accordance with the present invention does not depend on input clock signal symmetry to produce a 50/50 output symmetry.

It is another advantage of the present invention that a divide ratio of 1 is possible which is useful when the clock control circuit is used to ramp up internal clock frequencies in order to control power up surge, and high power dissipation chips.

A further advantage of the present invention is the capability of dynamically and synchronously switching frequency division ratio.

A further advantage of the present invention is the capability of expansion of the frequency division ratio through the addition of a counter and comparators.

Yet another advantage of the present invention is the maintenance of a constant output delay regardless of division ratios which can be important when the clock control circuit including frequency division is used in clock distribution or as a part of a feedback look such as in the case of a phase locked loop.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which:

FIG. 2, 2A and 2B are timing diagrams of the circuit of FIG. 1 in accordance with the present invention.

FIG. 4 is a timing diagram of the frequency doubler circuit of FIG. 3.

DETAILED DESCRIPTION OF A PREFERRED EMBODIMENT OF THE INVENTION

In clock timing systems for data processing systems, it is becoming more important to have the ability to control the frequency of the clock signal over a wide range of multiples.

For example, when a system is being powered up at the standard clock frequency, there will be a surge of power with attendant generation of heat due to the sudden change from a nonoperating state to operating at a high speed clock frequency.

In some respects, it is analogous to turning on a cold tungsten filament light bulb which has a very low resistance when cold. There is a very high surge current through the filament when cold due to the low resistance of the filament and the current decreases as the filament heats up which results in a higher resistance until the filament reaches normal operating temperature.

With respect to data processing systems, it is advantageous to begin the power on process using a clock frequency which is a submultiple of the standard operating frequency. For example, it may be useful to begin operation at power on time with a clock frequency which is one-fourth the standard operating frequency and then increase the clock frequency in digital steps from one-fourth to one-half and then to the standard operating frequency in a synchronous manner.

The invention to be described with respect to the preferred embodiment herein performs these functions with a simple yet elegant circuit which eliminates the problems of prior art clocking systems as discussed above with respect to background prior art.

Figure 1:
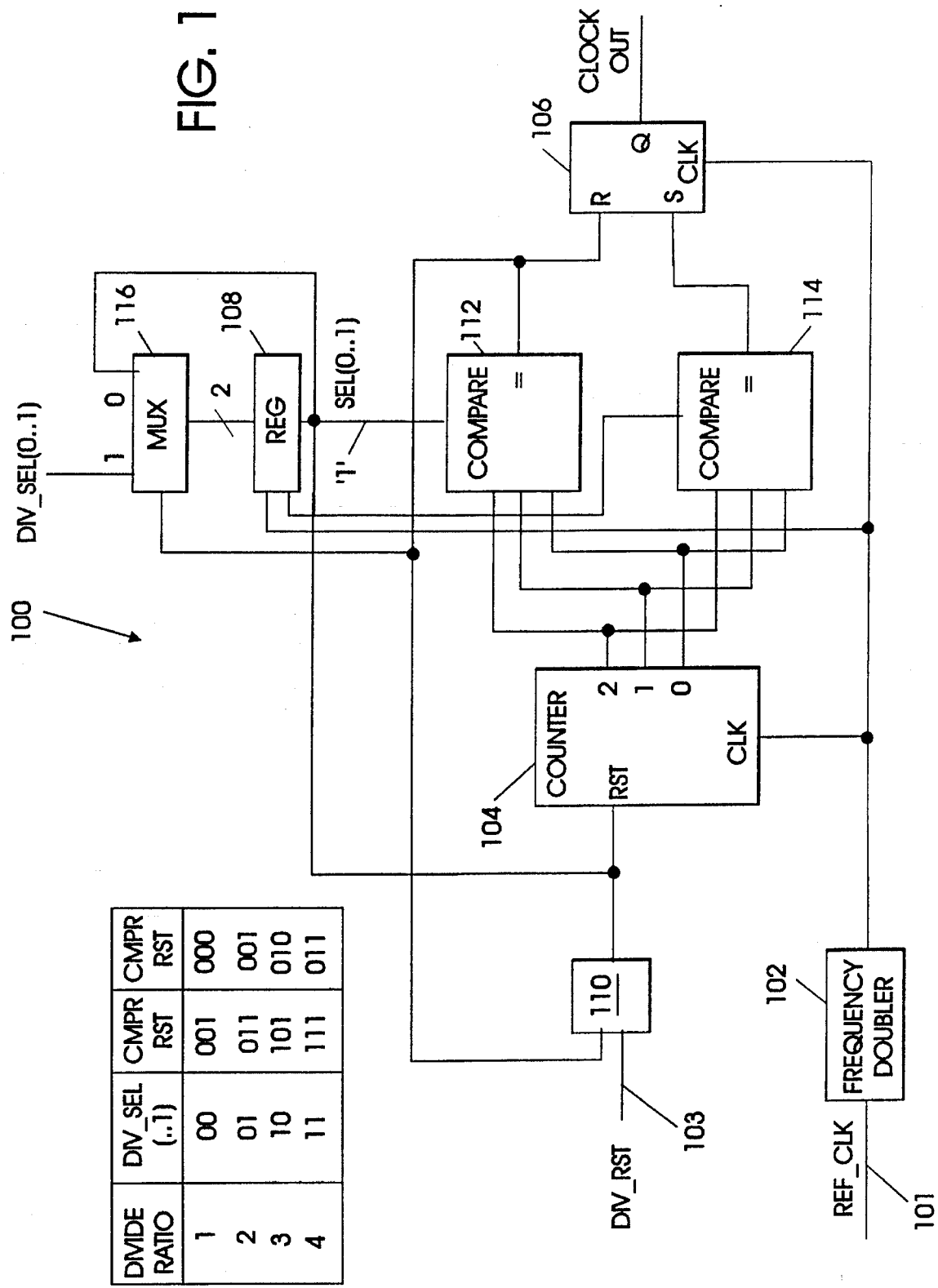
FIG. 1 is a block diagram of the clock control circuit in accordance with the present invention including off/even frequency division with symmetric output.

Referring now to FIG. 1, a dynamically switchable frequency division circuit having symmetric output for use in a clocking system of a data processing system will be described.

Clock divider circuit 100 has as inputs a reference clock signal on line 101 which may be from a crystal oscillator or a phase locked loop or other primary frequency source, and a divider reset signal on line 103 which provides a power on reset to the clock divider circuit. The reference clock signal on line 101 is connected to a frequency doubler 102 which will be described in more detail with reference to FIGS. 3 and 4. The 2X frequency output of frequency doubler 102 is connected to clock inputs of counter 104 and output latch 106 as well as to a clock input to divider select register 108. The divider reset line 103 is connected to one input of OR gate 110 which has its output connected to a reset input of counter 104 and to a reset input of select register 108. A second input of OR gate 110 is connected to the output of reset compare circuit 112.

Figure 2A:
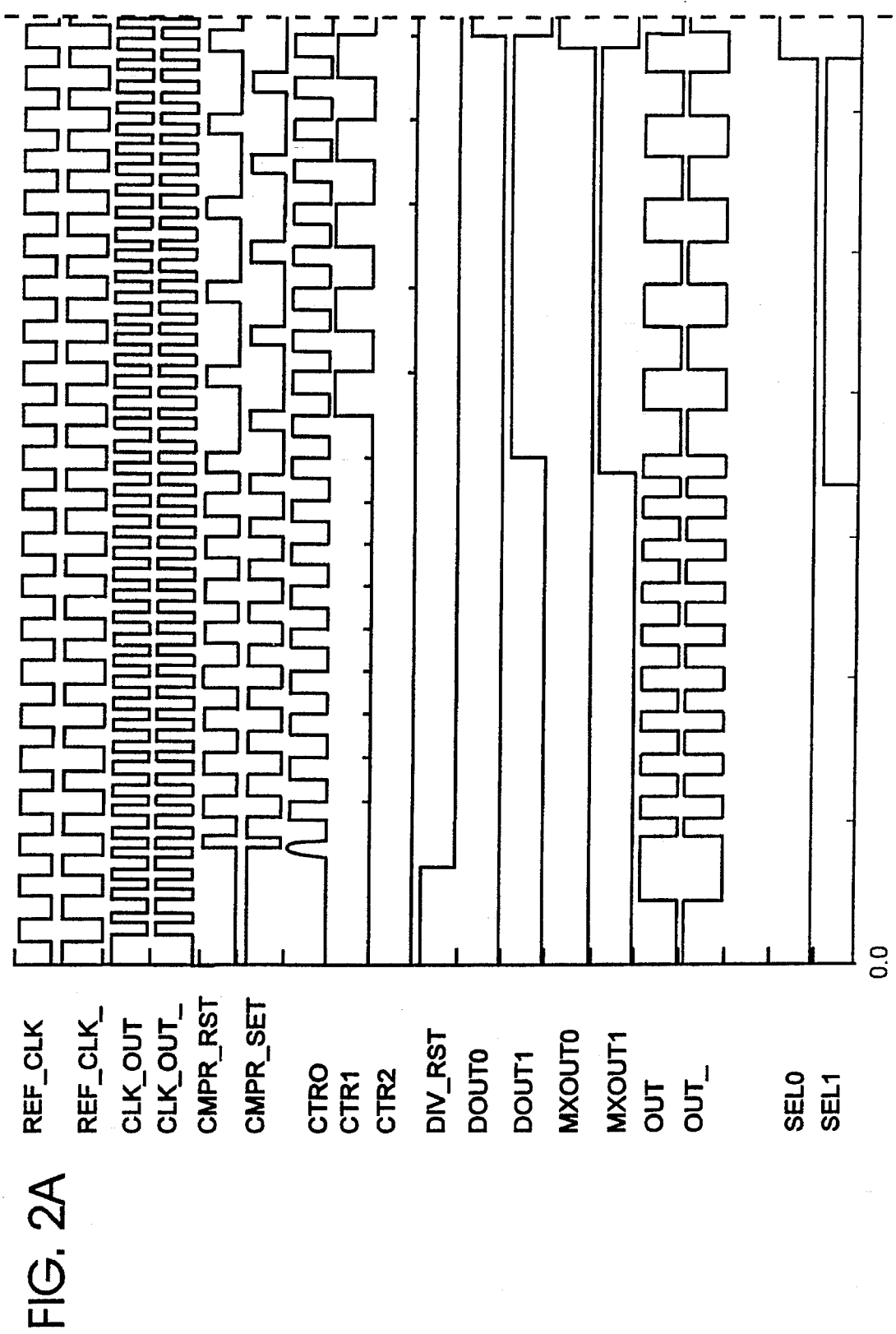

For ease of understanding of the operation of clock divider 100, reference should be made to the timing chart of FIG. 2. The input clock and its compliment are shown at the top of the timing chart, followed by the output of frequency doubler 102, including true and compliment outputs. The circuits in clock divider circuit 100 are operating at twice the normal clock frequency. The next pair of signals CMPRRST and CMPRSET are the outputs of the compare circuits 112 and 114, respectively. The signals CTR0, CTR1 and CTR2 represent the outputs of counter 104 with CTR0 being the high order bit, CTR1 being the intermediate order bit and CTR2 being the low order bit, respectively. Next, the divider reset line is shown which appears on line 103 as described above. The signals DOUT0 and DOUT1 represent the two outputs of register 108 to compare circuits 112 and 114, respectively. Signals MXOUT0 and MXOUT1 represent the outputs of multiplexor 116. The signals labeled OUT and OUT_ represent the true and compliment output of latch 106, which is the output clock signal to the data processing system. Lines SEL0 and SEL1 represent inputs to multiplexor 116 from a clock gating circuit (not shown)-which controls the integer divisor to be executed in clock divider circuit 100.

It should be noted that although clock divider circuit 100 is-shown and described with respect to a divisor of from 1 to 4 inclusive, the divisor and the integer division of the clock signal can be expanded through the addition of an additional counter circuit and compare circuits with appropriate gating logic.

In start up mode, clock input on line 101 is running at standard frequency and frequency doubler 102 provides a clock signal at twice the standard frequency with a high degree of precision as to the period of the output of frequency doubler 102. This provides consistent timing on any transition edge of the signal output of frequency doubler 102 for counting and comparing in clock divider circuit 100 without any dependency on symmetry of the reference clock signal on line 101.

When the divider reset line 103 drops, counter 104 is reset to an output of all zeros and register 108 is reset to all zeros. Counter 104 is a 3-bit counter which may have 8 states. The 8 states of counter 104 running at 2X standard frequency correspond to 4 states at the standard frequency. Register 108 in the preferred embodiment of the preferred invention is a 2-bit counter since the range of divisors is from 1–4, inclusive, only 2 bits are required for 4 values of divisor.

The 3-bit output of counter 104 provides a first set of inputs to compare circuits 112 and 114, respectively. In compare circuit 112, a least significant bit on a second set of inputs is fixed at a logical 1 and in compare circuit 114, a most significant bit on a second set of inputs is fixed at a logical 0. The other two bits of the second set of inputs are outputs of divide select register 108. Thus, when a divider reset is activated, counter 104 and divide select register 108 both provide zeros to compare circuits 112 and 114, which results in a true compare in compare 112 which resets the clock output latch 106, multiplexor 116 and counter 104. Counter 104 then begins counting at twice the standard clock rate based on the input from frequency doubler 102 to the clock input of counter 104. Concurrently, a divisor signal from external clock gating means is gated through multiplexor 116 to register 108.

The divide ratio, the divisor select signal (a 2-bit signal), the compare reset and compare set inputs from register 108 are shown in the table associated with FIG. 1.

Note from the timing chart of FIG. 2 that when lines SEL0 and SEL1 are both at 0, the divide ratio is set to 1 and the output from output latch 106 is at the same frequency as the clock input on line 101. However, when line select 1 goes to 1, the frequency of the output latch 106 is halved after the CTR1 signal from counter 104 is output at half the referenced clock rate to compare circuits 112 and 114. Similarly, when line SEL1 goes to 0 and SEL1 goes to 1, the output frequency from latch 106 is reduced to a frequency of one-third of the reference clock signal. If both SEL1 and SEL0 are 1, signals CTR0, CTR1 and CTR2 are all running as outputs to compare circuits 112 and 114 which results in an output of latch 106 of one-fourth the reference clock signal on line 101.

Figure 3:
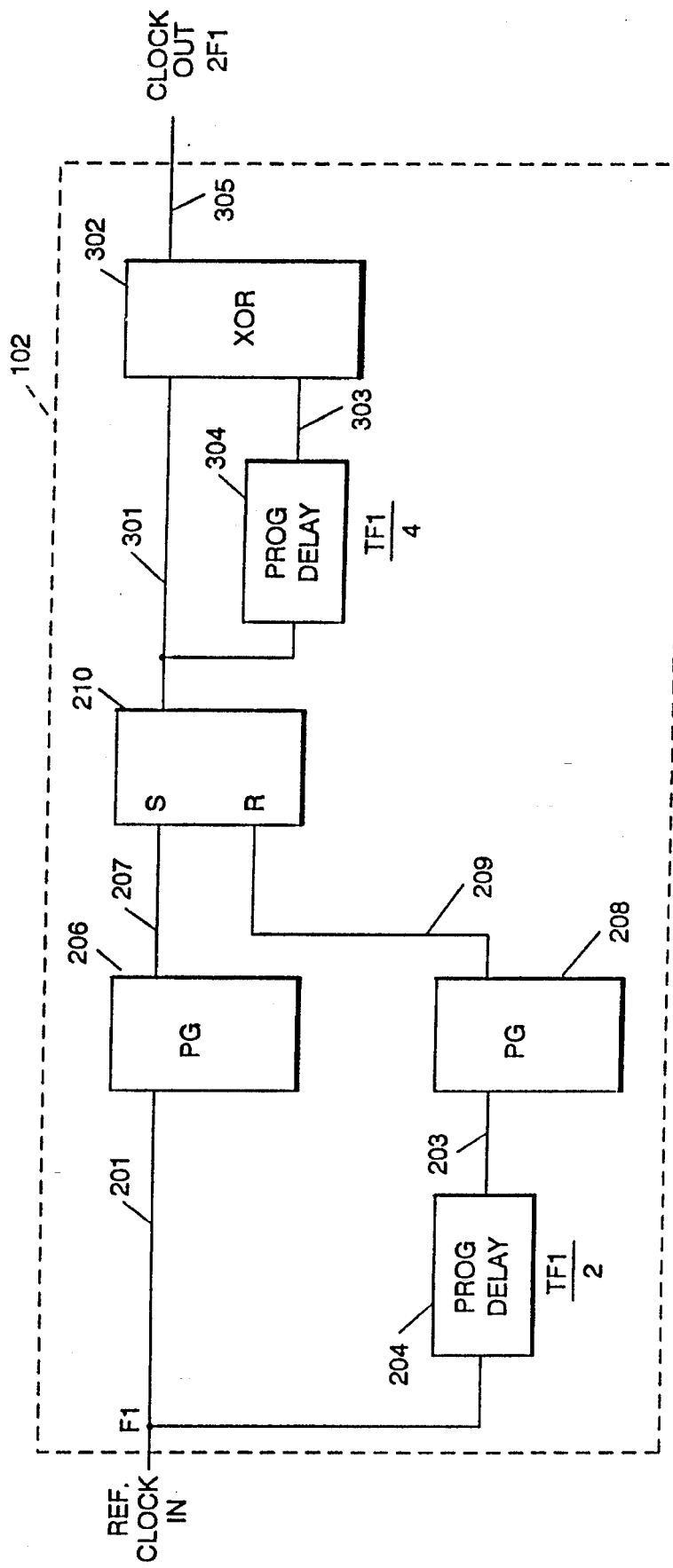
FIG. 3 is a block diagram of a frequency doubler circuit in accordance with the present invention.

Referring now to FIGS. 3 and 4, frequency doubler circuit 102 which is an important component of clock divider 100 will be described.

It is a common problem with clock signals that symmetry can not be guaranteed because of variations in the trailing edge of the clock signal. However, the period of the clock signal (the time from leading edge to leading edge) is consistent. Therefor, a symmetrical clock signal can be derived from a circuit which depends only on the leading edge of the clock.

A reference clock signal at a frequency F1, having unknown symmetry, is input to frequency doubler circuit 102 on line 201. Line 201 is connected to an input of pulse generator circuit 206 which provides a pulse of a predetermined duration (some fraction of a cycle) when the input goes positive. It is understood, that a pulse generator circuit could also be used which generates a pulse output on a negative going input. The out put of PG 206 is connected by line 207 to a set input of latch 210, thus setting latch 210 at the start of each cycle of reference clock signal 201.

Reference clock 201 is also connected to an input of a programmable delay circuit 204 which is programmed to delay the input signal for a time equal to one half the period of F1, or, TF½. The delayed clock signal on line 203 is connected to an input of a second pulse generator circuit 208 which generates an output pulse connected to a reset input of latch 210 by line 209. Thus, latch 210 is reset at TF½.

The output of latch 210 on line 301 is a perfectly symmetrical signal which can then be used to provide a frequency equal to 2F1.

The key element of frequency doubler 102 is exclusive or circuit 302. Exclusive or circuits produce a high output whenever the 2 inputs are different. A first input to exclusive or circuit 302 is the symmetrical clock signal on line 301. This clock signal is also input to a second programmable delay circuit 304. The output of the programmable delay circuit on line 303 is connected to exclusive or 302 as the second input. To achieve the desired 2F1 frequency output from frequency doubler circuit 102, programmable delay 304 is set to a delay equal to TF¼. This causes the inputs to exclusive or 302 to be different every quarter cycle of F1 which results in an output on line 305 at a frequency of 2F1.

It should be noted that if the symmetry of the reference clock signal on line 201 is stable, latch 210, pulse generators 206 and 208, and programmable delay 204 can be eliminated.

Referring to FIG. 4, it can be seen that during a first time interval, t0–t2, the reference clock signal on line 201 is high and the half cycle delayed clock signal on line 203 is low. This provides a positive going leading edge at 0 and 180 degrees of each cycle of the reference clock on lines 201 and 203 respectively. Each positive going edge produces a pulse from the associated PG 206 or 208. The set and reset of latch 210 at 0 and 180 degrees of each clock cycle, produce a symmetrical output signal on line 301 at frequency F1. Since delay circuit 304 is programmed to a delay of one quarter of the period of the reference clock signal, one of the 2 inputs to Exclusive Or 302 on lines 301 and 303 change each quarter cycle of the reference clock, at times t0, t1, t2, etc. This results in the clock out signal on line 305 to be cycling at a rate of 2F1 since the exclusive or circuit 302 provides a high output when the inputs are at different levels, and a low output when the 2 inputs are at the same level.

Programmable delay 304 is digitally programmed to provide a time delay of one-fourth of the period of the reference clock. Thus, a period of the reference clock, t0–t4 is divided by four and the result, represented in FIG. 4 by the duration t0–t1, is programmed into programmable delay 304.

Although the present invention and its advantages have been described in detail, it should be understood that various changes, substitutions and alterations can be made herein without departing from the spirit and scope of the invention as defined by the appended claims.

What is claimed is:

1. A dynamically switchable frequency clock system for use in a data processing system, comprising:

a frequency doubler circuit for doubling a frequency of an input signal to improve resulting of the clock system;

a counter controlled by a divisor select signal, said counter having an input connected to an output of said frequency doubler circuit;

first and second compare circuits, each having a first set of inputs connected to outputs of said counter and a second set of inputs connected to outputs from a divisor select circuit, said first compare circuit having an output connected to a counter reset gate and to a reset input of a clock out latch, said second compare circuit having an output connected to a set input of said clock out latch; and a latch for providing a dynamically selectable frequency clock signal in response to an input clock signal and a selected divisor.

2. A dynamically switchable frequency clock system according to claim 1, further comprising a divisor select circuit having outputs connected to said first and second compare circuits for establishing a frequency divide ratio.

3. A dynamically switchable frequency clock system according to claim 1 wherein said frequency doubler circuit further comprises an exclusive or circuit having a first input connect to an input clock signal and a second input connected to a delayed input clock signal wherein said delayed input clock signal has a pre-determined time delay.

4. A dynamically switchable frequency clock system for use in a data processing system, comprising: a frequency doubler circuit for doubling a frequency of an input signal to improve resulting of the clock system;

a divisor select circuit having a clock input from said frequency doubler circuit;

a compare circuit, for synchronizing a change in frequency resulting from a change in outputs of said divisor select circuit; and a latch for providing a dynamically selectable frequency clock signal in response to an input clock signal and a selected divisor.

5. A dynamically switchable frequency clock system for use in a data processing system according to claim 4, wherein said frequency doubler circuit further comprises:

an exclusive or circuit having a first input connect to an input clock signal and a second input connected to a delayed input clock signal wherein said delayed input clock signal has a pre-determined time delay.

6. A dynamically switchable frequency clock system for use in a data processing system according to claim 5, wherein said predetermined time delay equals one fourth of a period of said input clock signal.

7. A dynamically switchable frequency clock system for use in a data processing system according to claim 6, wherein said frequency doubler circuit further comprises:

a symmetry control circuit to control symmetry of a signal generated from said input clock signal.

* * * * *